(12) United States Patent
Li et al.

(10) Patent No.: US 9,331,694 B2
(45) Date of Patent: *May 3, 2016

(54) CAPACITIVE COUPLING BASED PROXIMITY SENSOR

(75) Inventors: Jay Li, Sunnyvale, CA (US); John Teegen, Los Gatos, CA (US)

(73) Assignee: Silego Technology, Inc., Santa Clara, CA (US)

( * ) Notice: Subject to any disclaimer, the term of this patent is extended or adjusted under 35 U.S.C. 154(b) by 373 days.

This patent is subject to a terminal disclaimer.

(21) Appl. No.: 13/492,744

(22) Filed: Jun. 8, 2012

(65) Prior Publication Data

US 2012/0315847 A1     Dec. 13, 2012

Related U.S. Application Data

(63) Continuation-in-part of application No. 13/072,578, filed on Mar. 25, 2011, now Pat. No. 8,395,370.

(60) Provisional application No. 61/317,599, filed on Mar. 25, 2010, provisional application No. 61/400,394, filed on Jul. 26, 2010, provisional application No. 61/412,340, filed on Nov. 10, 2010, provisional application No. 61/494,811, filed on Jun. 8, 2011.

(51) Int. Cl.
    *G01R 31/06*     (2006.01)
    *H03K 17/975*     (2006.01)
    *G01R 27/00*     (2006.01)

(52) U.S. Cl.
    CPC .............. *H03K 17/975* (2013.01); *G01R 27/00* (2013.01); *H03K 2217/960775* (2013.01)

(58) Field of Classification Search
    CPC ....... G06F 3/044; G06F 3/0416; G06F 3/041; G06F 2203/04106; G06F 1/3262; G06F 2203/04101; G06F 3/0414; G06F 3/045; G06F 3/04815; G06F 3/0488; G01R 27/2605; G01R 35/00; G01R 1/18; G01R 19/00; G01D 5/24; H04B 5/0012; H04B 5/0031; H04B 5/0068; H04B 5/0075

See application file for complete search history.

(56) References Cited

U.S. PATENT DOCUMENTS 3,172,075 A   *   3/1965   Kay ............................. 367/102
5,606,303 A       2/1997   Suski
5,805,067 A   *   9/1998   Bradley et al. ............... 340/635

(Continued)

FOREIGN PATENT DOCUMENTS

JP        H01103319       4/1989
JP        201076475       8/2010

OTHER PUBLICATIONS

JP Utility Model Publication No. 1-86327.

*Primary Examiner* — Vinh Nguyen
(74) *Attorney, Agent, or Firm* — Van Pelt, Yi & James LLP (57) ABSTRACT

A capacitive coupling based proximity sensor is disclosed. In some embodiments, a sensor embedded in a mobile device comprises a transmitter configured to transmit a transmit signal and a receiver configured to receive a receive signal via capacitive coupling between the receiver and the transmitter as well as a circuit configured to detect human proximity to the mobile device in the event that the receive signal does not sufficiently match the transmit signal and configured to generate an output signal indicating human proximity to the mobile device that is employed to facilitate an appropriate response.

54 Claims, 8 Drawing Sheets (56) References Cited

U.S. PATENT DOCUMENTS

| | | |
|---|---|---|
| 7,154,288 B2 | 12/2006 | Kakizawa et al. |
| 7,428,142 B1 | 9/2008 | Ligtenberg et al. |
| 7,880,481 B2* | 2/2011 | Zangl et al. ............... 324/684 |
| 7,957,762 B2 | 6/2011 | Herz et al. |
| 8,077,032 B1* | 12/2011 | Vier et al. ............. 340/539.23 |
| 8,395,370 B2* | 3/2013 | Froniewski et al. ...... 324/76.11 |
| 2003/0064761 A1* | 4/2003 | Nevermann ............... 455/572 |
| 2003/0085679 A1 | 5/2003 | Bledin et al. |
| 2006/0022682 A1 | 2/2006 | Nakamura et al. |
| 2008/0181353 A1 | 7/2008 | Ogata et al. |
| 2009/0058429 A1 | 3/2009 | Harris et al. |
| 2009/0086879 A1 | 4/2009 | Ogata et al. |
| 2009/0160461 A1 | 6/2009 | Zangl et al. |
| 2010/0207911 A1* | 8/2010 | Newton ..................... 345/175 |
| 2010/0292945 A1 | 11/2010 | Reynolds et al. |
| 2011/0319015 A1* | 12/2011 | Canegallo et al. .......... 455/41.1 |

\* cited by examiner

CAPACITIVE COUPLING BASED PROXIMITY SENSOR

CROSS REFERENCE TO OTHER APPLICATIONS

This application claims priority to U.S. Provisional Patent Application No. 61/494,811 entitled CELLPHONE ALARM NOTIFICATION FOR AWARENESS OF RADIATION INCREASE filed Jun. 8, 2011, which is incorporated herein by reference for all purposes.

This application is a continuation-in-part of co-pending U.S. patent application Ser. No. 13/072,578 entitled CAPACITIVE COUPLING BASED SENSOR filed Mar. 25, 2011, now U.S Pat. No. 8,395,370, which claims priority to U.S. Provisional Patent Application No. 61/317,599 entitled PROXIMITY SWITCH filed Mar. 25, 2010; U.S. Provisional Patent Application No. 61/400,394 entitled CLOSE PROXIMITY SENSOR TECHNOLOGY filed Jul. 26, 2010; and U.S. Provisional Patent Application No. 61/412,340 entitled CLOSE PROXIMITY SENSOR filed Nov. 10, 2010, all of which are incorporated herein by reference for all purposes.

BACKGROUND OF THE INVENTION

Figure 1:
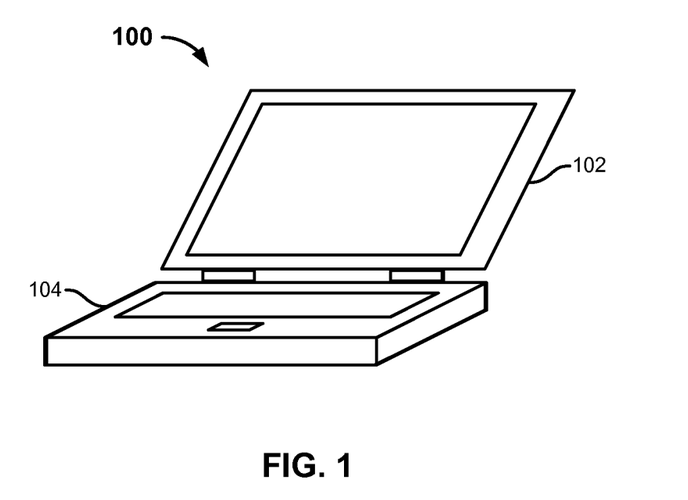
FIG. 1 illustrates an embodiment of the general clamshell mechanical configuration of a notebook computer.

Position detection switches have many applications. For example, a laptop or notebook computer typically includes a lid switch that triggers a sleep state when the lid of the device, which typically comprises the display of the device, is closed. FIG. 1 illustrates an embodiment of the general clamshell mechanical configuration of a notebook computer. As depicted, notebook computer 100 comprises a display plane 102 and a keyboard/control electronics plane 104. Planes 102 and 104 are hinged, allowing display plane 102 to be closed down onto keyboard plane 104 when the notebook computer is not being used. An open or closed state of notebook computer 100 is typically indicated by the state of a switch associated with planes 102 and 104. The state of the switch changes based on the positions of planes 102 and 104 relative to one another.

Existing lid switches most commonly comprise Hall Effect switches. Hall Effect switches require a magnet to be placed on either plane 102 or plane 104 and a sensor to be placed on the opposing plane. The magnet comprises a three-dimensional volume and may comprise an undesirable form factor, especially if placed on plane 102 since it may affect the maximum achievable active area of the display. However, more difficult routing may result if the magnet is instead placed on plane 104 and the sensor is placed on plane 102 since in such cases the signal from the sensor on plane 102 needs to be routed through the clamshell hinge to electronics on plane 104. Furthermore, the magnet of a Hall Effect switch may produce an undesirable magnetic field. The magnetic field may detrimentally affect certain functions associated with notebook computer 100, such as those requiring a compass. Moreover, magnets are relatively expensive components and require special processing and handling during manufacturing. Other commonly employed switches include mechanical displacement switches and optical beam interruption switches. Such switches may present similar form factor, routing, and manufacturing issues as Hall Effect switches and may also be affected by foreign object contaminations.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims, and the invention encompasses numerous alternatives, modifications, and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

Various configurations of an integrated circuit based sensor that employs capacitive coupling are disclosed. In some embodiments, such a sensor may be used as a switch. The disclosed techniques may be employed, for example, to differentiate between a plurality of states (e.g., true/false states, open/close states, on/off states, touch or close proximity states, etc.) and to generate an output signal based on the detected state that can be employed to facilitate an appropriate response. The disclosed sensor designs may be employed in a wide array of industrial applications. In some embodiments, the sensor may be employed as a position detection switch. Applications of such switches include, but are not limited to, lid switches of laptop computers such as notebook computer 100 of FIG. 1, mobile phones, PDAs, and other electronic devices; switches to detect printer latches and/or tray states; intrusion detection switches for systems such as for the hard drives of a data storage system; etc. In some embodiments, the sensor may be employed as a touch or proximity detection sensor. Applications of such sensors include, but are not limited to, touch sensors that replace mechanical buttons or switches; touch sensors for touch screens or track pads; close proximity or presence detection sensors, for example, that wake up systems such as tablet computers, mobile phones, PDAs, or other electronic devices from sleep states; etc. The capacitive coupling based sensor design described herein offers many advantages including low cost, low power consumption, and small form factor. Although some examples of sensor configurations and applications are provided herein, the disclosed techniques may be similarly employed with respect to any other appropriate configurations and applications.

Figure 2A:
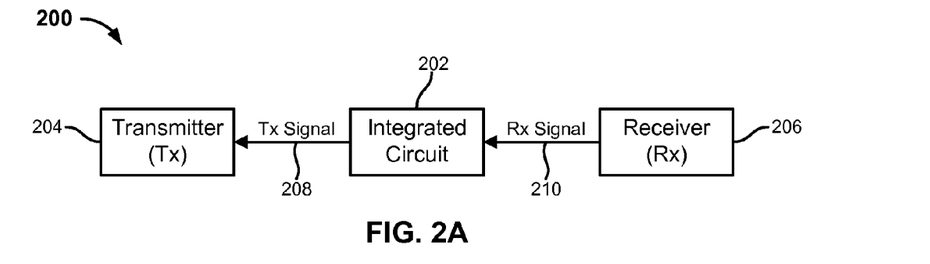
FIG. 2A illustrates a high-level block diagram of an embodiment of an integrated circuit based sensor that relies on capacitive coupling.

FIG. 2A illustrates a high-level block diagram of an embodiment of an integrated circuit based sensor that relies on capacitive coupling. As depicted, sensor 200 includes integrated circuit 202, transmitter 204, and receiver 206. Integrated circuit 202 generates a signal 208 that is transmitted by transmitter antenna 204. Furthermore, a signal 210 received by receiver antenna 206 is input into integrated circuit 202. Integrated circuit 202 compares transmitted signal 208 and received signal 210 to determine a state. For instance, integrated circuit 202 detects a first state if received signal 210 matches transmitted signal 208 and detects a second state if received signal 210 does not match transmitted signal 208. In such cases, for example, the first state would be detected by integrated circuit 202 if transmitter 204 and receiver 206 are sufficiently capacitively coupled such that the signal transmitted by transmitter 204 is received with adequate power or strength and/or within a threshold amount of error at receiver 206, and the second state would be detected by integrated circuit 202 if the signal transmitted by transmitter 204 is not received or is not received with adequate power or strength and/or within a threshold amount of error at receiver 206. Changes in coupling between transmitter 204 and receiver 206 are relied upon to differentiate between two or more states. Integrated circuit 202 actively scans received signal 210 for the transmitted pattern 208 and generates an output signal (not shown in FIG. 2A) based on the detected state. In some embodiments, the output signal comprises a binary true/false or I/O signal. The output signal may be employed by system management or other circuitry to facilitate an appropriate response or event. In various embodiments, the components of sensor 200 may be arranged in any appropriate mechanical configurations. In some embodiments, the components of sensor 200 are distributed across a plurality of planes that may be moved relative to one another in one or more directions, and such relative motion results in changes in capacitive coupling between transmitter 204 and receiver 206. In other embodiments, the active components of sensor 200 (i.e., integrated circuit 202, transmitter 204, and receiver 206) may be situated on approximately the same plane, and a passive component (not shown in FIG. 2A) that moves relative to the active components changes the extent of capacitive coupling, if any, between transmitter 204 and receiver 206 based on its position. These and other embodiments are described in further detail below.

Figure 2B:
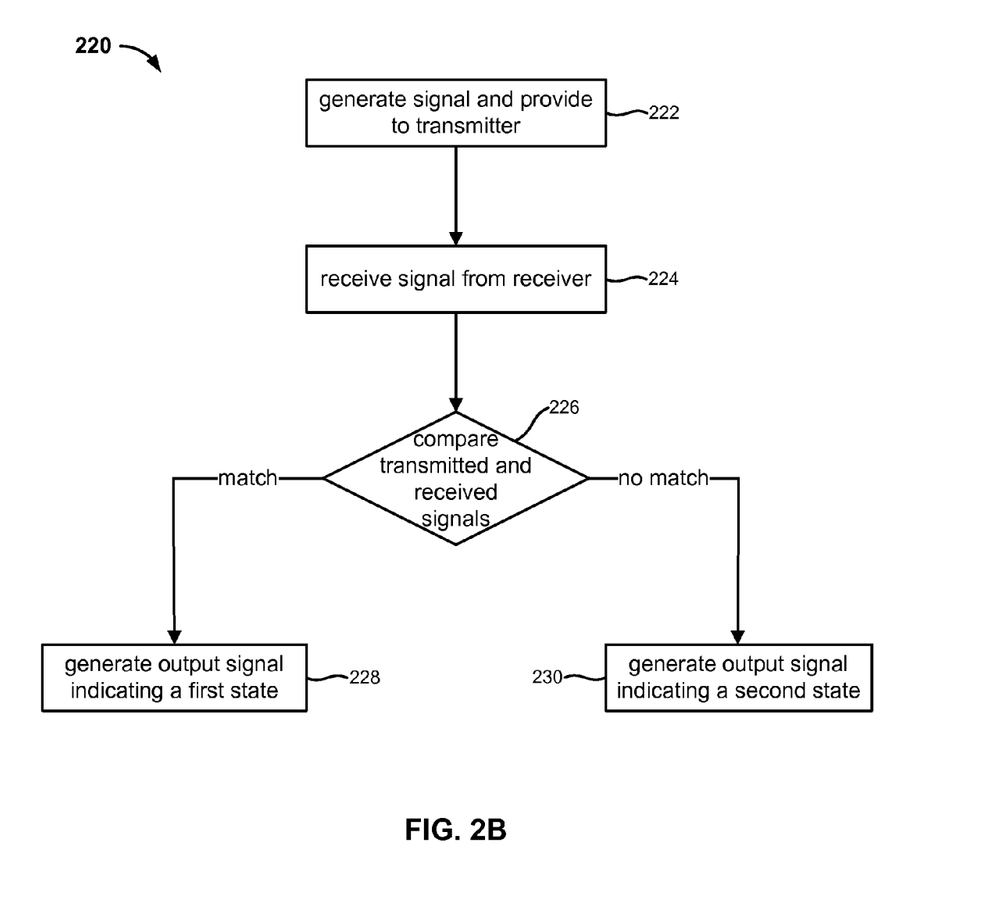
FIG. 2B illustrates an embodiment of a process for generating an output signal that indicates a state.

FIG. 2B illustrates an embodiment of a process for generating an output signal that indicates a state. In some embodiments, process 220 is employed by integrated circuit 202 of sensor 200 of FIG. 2A. Process 220 starts at 222 at which a signal is generated and provided to a transmitter. In some embodiments, the generated signal comprises a uniquely patterned signal. In some cases, the generated signal comprises a unique bit stream comprising either a fixed or configurable number of bits. For example, in one embodiment, the generated signal comprises a serial eight-bit stream. The pattern of the signal may be automatically selected or may be user configurable. In some embodiments, the signal comprises a low power and/or low frequency (e.g., 41 kHz) signal that does not substantially interfere with other applications such as Wi-Fi, Bluetooth, wireless radio, etc. At 224, a signal is received from a receiver. At 226, the transmitted and received signals are compared to determine whether the two signals match. Any appropriate matching algorithm as well as matching criteria and/or thresholds may be employed at 226 to determine whether the transmitted and received signals match or not. In some embodiments, 226 includes determining whether the power or strength (e.g., voltage) of the received signal satisfies a threshold. In some embodiments, determining whether the transmitted and received signals match at 226 comprises determining an error between the transmitted and received signals. In such cases, for example, a match condition may be satisfied if no or not more than a threshold amount of error between the transmitted and received signals is detected. In some embodiments, determining whether the transmitted and received signals match at 226 comprises determining whether the two signals match on average and/or consecutively for at least a prescribed number of samples. For example, in one embodiment, eight thousand samples of the transmitted pattern need to be consecutively or nearly consecutively (e.g., on average) detected in the received signal in order to satisfy a match condition. If it is determined at 226 that the transmitted and received signals match, an output signal indicating a first state of the sensor is generated at 228. If it is determined at 226 that the transmitted and received signals fail to match, an output signal indicating a second state of the sensor is generated at 230. The output signal generated at 228 and 230 may be employed, for example, to trigger an event or action for which the sensor is being used by an associated system.

Figure 3A:
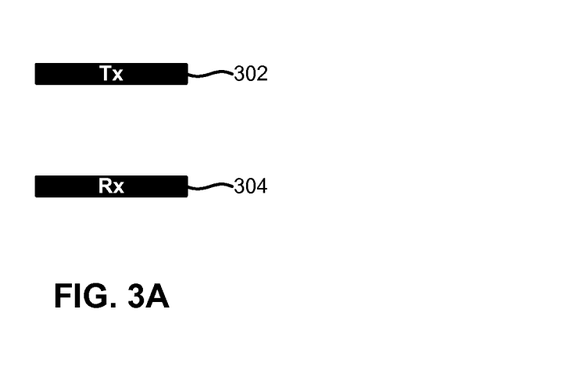
FIG. 3A illustrates an embodiment of the transmitter and receiver portions of a sensor configuration in which the two components are situated on different planes.

FIG. 3A illustrates an embodiment of the transmitter and receiver portions of a sensor configuration in which the two components are situated on different planes. Although not depicted in FIG. 3A, the integrated circuit of the sensor is connected to both transmitter 302 and receiver 304 as depicted in FIG. 2A and may be situated on the same plane as either transmitter 302 or receiver 304 or on a different plane. In the given example, the coupling, if any, between transmitter 302 and receiver 304 changes in response to motion in one or more directions between the components. For example, in different embodiments, transmitter 302 and receiver 304 may be moved relative to one another in one or more of the x, y, and z directions. Based on the relative position of transmitter 302 and receiver 304 at any given time, receiver 304 either adequately picks up the signal transmitted by transmitter 302 via capacitive coupling or does not. A stronger signal is received by receiver 304 as the capacitance between transmitter 302 and receiver 304 increases, e.g., as the distance between transmitter 302 and receiver 304 decreases and/or as they become more aligned (e.g., their surface areas become more aligned). In some embodiments, transmitter 302 and receiver 304 have the same and/or similar shapes and/or geometries, e.g., to facilitate better capacitive coupling between the two components. As previously described, the associated integrated circuit compares the transmitted and received signals to generate an appropriate output signal.

Figure 3B:
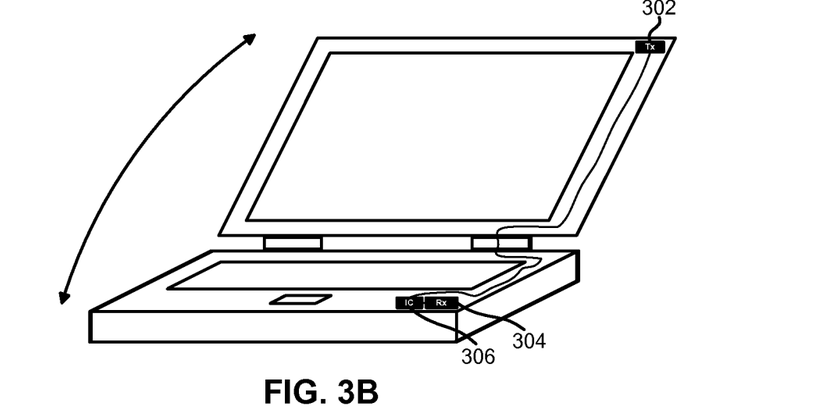
FIG. 3B illustrates an embodiment of an application of the sensor configuration of FIG. 3A.

FIG. 3B illustrates an embodiment of an application of the sensor configuration of FIG. 3A. As depicted, the sensor in FIG. 3B is employed as a lid switch of a notebook computer. In the given example, transmitter 302 is situated on the display plane and receiver 304 as well as associated integrated circuit 306 are situated on the keyboard plane of the notebook computer. Integrated circuit 306 is connected to both transmitter 302 and receiver 304, with the connection to transmitter 302 being routed through the keyboard plane, hinge, and display plane of the notebook computer. In this example, the extent of capacitive coupling, if any, between transmitter 302 and receiver 304 depends on the angle between the display plane and the keyboard plane of the notebook computer. A match state is detected by integrated circuit 306 when the notebook clamshell planes are closed or nearly closed such that the transmitter side of the capacitor plate and the receiver side of the capacitor plate are in close enough proximity for the circuit to be complete, i.e., for receiver 304 to adequately receive the transmitted signal. Conversely, an unmatch state is detected by integrated circuit 306 when the notebook clamshell planes are open since in such cases the capacitive coupling, if any, between transmitter 302 and receiver 304 is too weak to complete the circuit, i.e., for receiver 304 to adequately receive the transmitted signal. In this example, a match state may be employed by the notebook computer to enter a standby or sleep mode while an unmatch state may be employed by the notebook computer to wake up.

Figure 4A:
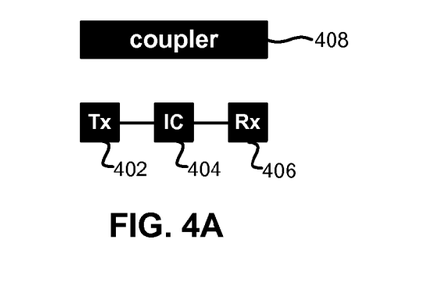
FIG. 4A illustrates an embodiment of a sensor configuration that employs a coupler.

FIG. 4A illustrates an embodiment of a sensor configuration that employs a passive coupler. In this example, the active components of the sensor (transmitter 402, integrated circuit 404, and receiver 406) are situated on the same plane and thus are stationary relative to one another. However, in this embodiment, the sensor includes a passive component—coupler 408. In some embodiments, coupler 408 comprises a conductive material such as a metal strip or plate. No physical connection or contact exists between active components 402-406 and coupler 408, and coupler 408 is situated in a different plane than active components 402-406. Movement between the coupler and active components planes changes a coupling condition between transmitter 402 and receiver 406. In various embodiments, the planes may be moved relative to one another in one or more of the x, y, and z directions. In some embodiments, the shape and/or geometry of coupler 408 is selected (e.g., to match transmitter 402 and receiver 406) to facilitate coupling between transmitter 402 and receiver 406. Coupler 408 facilitates capacitive coupling between transmitter 402 and receiver 406, for example, when in close proximity to and/or properly aligned with transmitter 402 and receiver 406. Depending upon whether coupler 408 effectively bridges transmitter 402 and receiver 406 and closes the circuit between the two via capacitive coupling, receiver 406 either adequately picks up the signal transmitted by transmitter 402 or does not. A stronger signal is received by receiver 406 as the capacitances between coupler 408 and transmitter 402 and receiver 406 increase, e.g., as the distance between coupler 408 and the active components plane decreases and/or as coupler 408 becomes more aligned with transmitter 402 and receiver 406. As previously described, integrated circuit 404 compares the transmitted and received signals to generate an appropriate output signal.

Figure 4B:
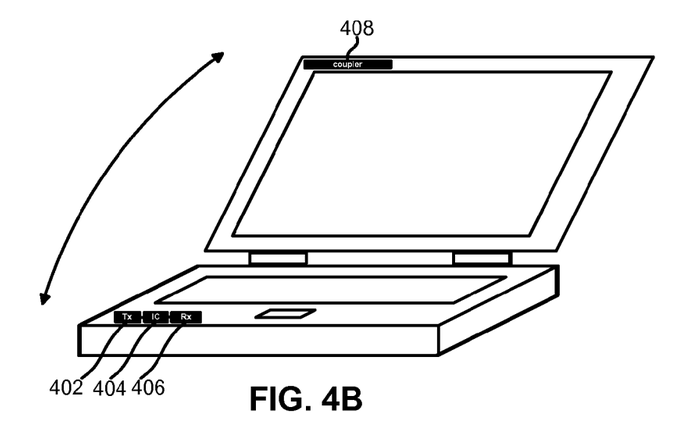
FIG. 4B illustrates an embodiment of an application of the sensor configuration of FIG. 4A.
Figure 4C:
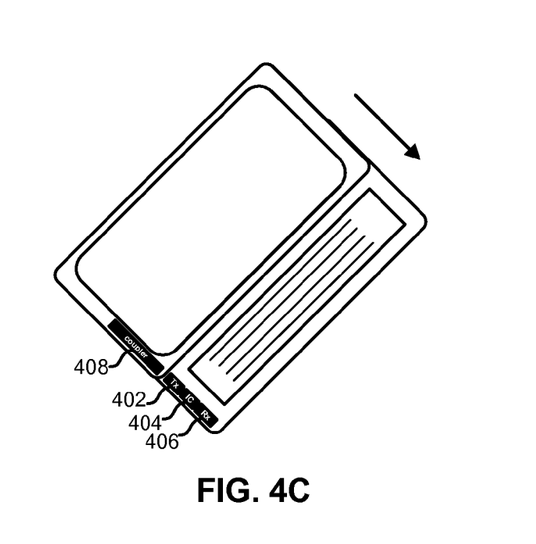
FIG. 4C illustrates an embodiment of an application of the sensor configuration of FIG. 4A.

FIG. 4B illustrates an embodiment of an application of the sensor configuration of FIG. 4A. As depicted, the sensor in FIG. 4B is employed as a lid switch of a notebook computer. In the given example, active components 402-406 are situated on the keyboard plane and coupler 408 is situated on the display plane of the notebook computer. Integrated circuit 404 is connected to both transmitter 402 and receiver 406. However, coupler 408 comprises a floating component of the sensor since it is not physically connected and/or in physical contact with any of active components 402-406. In this example, the extent of capacitive coupling, if any, between transmitter 402 and receiver 406 depends on the angle between the display plane and the keyboard plane of the notebook computer, i.e., the proximity and/or alignment of coupler 408 with respect to transmitter 402 and receiver 406. A match state is detected by integrated circuit 404 when the notebook clamshell planes are closed or nearly closed such that coupler 408 is in close enough proximity and alignment for the circuit to be complete, i.e., for receiver 406 to adequately receive the transmitted signal. Conversely, an unmatch state is detected by integrated circuit 404 when the notebook clamshell planes are open since in such cases coupler 408 is too far away to capacitively couple transmitter 402 and receiver 406 and complete the circuit, i.e., for receiver 406 to adequately receive the transmitted signal. In this example, a match state may be employed by the notebook computer to enter a standby or sleep mode while an unmatch state may be employed by the notebook computer to wake up. FIG. 4C illustrates an embodiment of another application of the sensor configuration of FIG. 4A that is employed to detect open and close states of the slide-out keyboard of a smart phone.

Figure 5A:
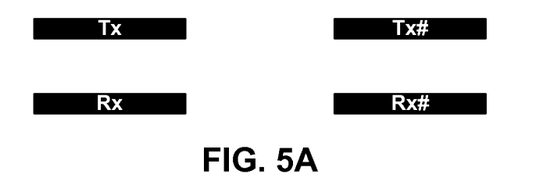
FIG. 5A illustrates an embodiment of a differential configuration in which the transmitters and receivers are situated on separate planes.
Figure 5B:
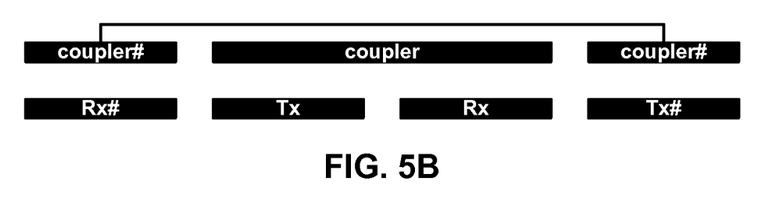
FIGS. 5B-5C illustrate embodiments of differential configurations in which the transmitters and receivers are situated on the same plane and are coupled via passive couplers.
Figure 5C:
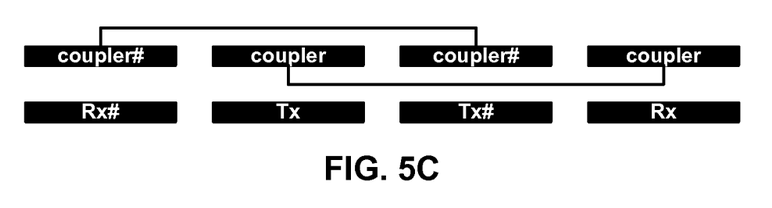

The sensor embodiments of FIGS. 3A and 4A comprise single-ended configurations. In some embodiments, a differential configuration may be desirable. A differential configuration may provide, for example, improved range and/or security. For instance, a differential configuration may decrease sensor sensitivity to noise and/or interferences in the external environment which may otherwise be conducive to false outcomes. FIG. 5A illustrates an embodiment of a differential configuration in which the transmitters and receivers are situated on separate planes. The differential configuration of FIG. 5A is analogous to the single-ended configuration of FIG. 3A. FIGS. 5B-5C illustrate embodiments of differential configurations in which the transmitters and receivers are situated on the same plane and are coupled via passive couplers. The differential configurations of FIGS. 5B-5C are analogous to the single-ended configuration of FIG. 4A. One or both of the couplers in the crossed or keyed embodiments of FIGS. 5B-5C comprise multiple portions that are electrically connected together by a wire. In some embodiments, the Tx# and Rx# signals in FIGS. 5A-5C are inverted versions of the Tx and Rx signals, respectively. In the differential configurations of FIGS. 5A-5C, the corresponding pairs of transmitters and receivers (i.e., Tx and Rx; Tx# and Rx#) would not be properly coupled unless the correct configuration is employed, resulting in designs that are more immune to the influence of noise and other external factors. Although single-ended and differential configurations have been described, in other embodiments, a sensor may comprise any number of transmitters, receivers, and/or couplers, which may comprise any number of connected coupler portions.

Figure 6A:
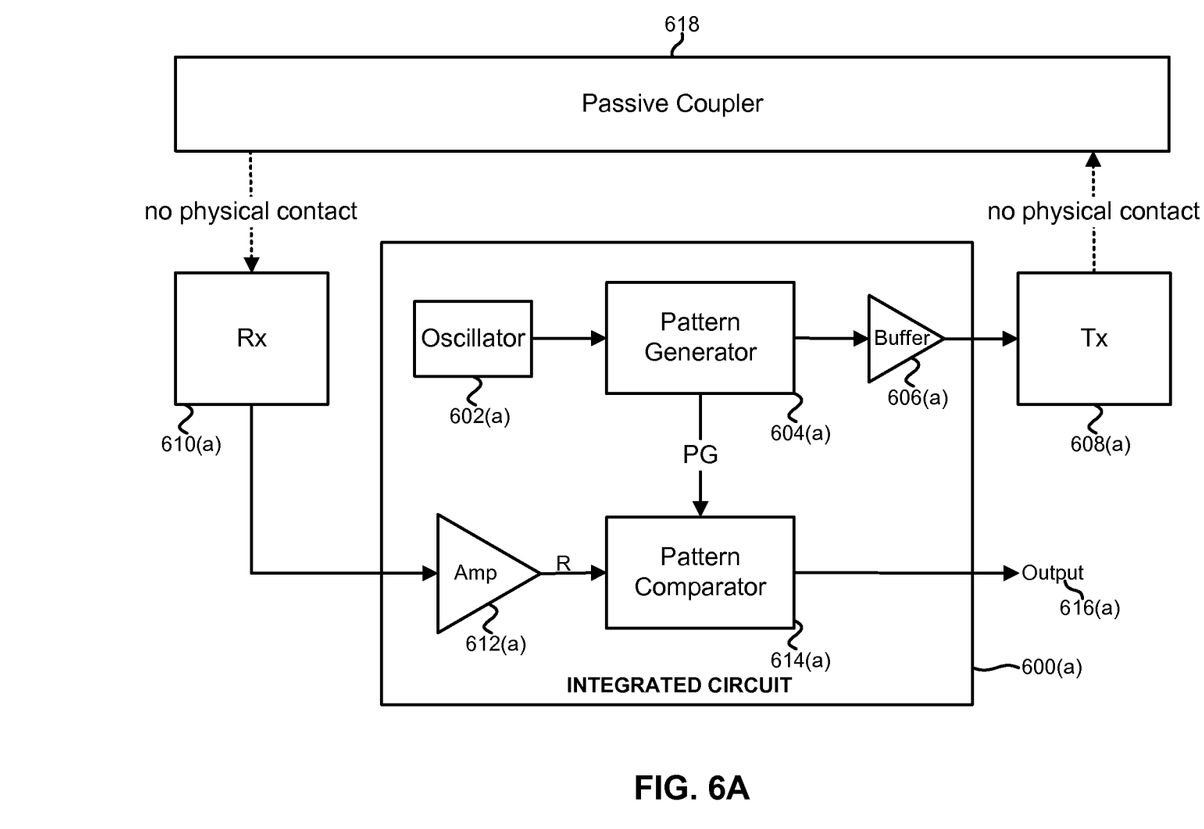
FIGS. 6A-6B illustrate circuit diagrams of two different sensor embodiments that show the major components of the integrated circuit of the disclosed sensor design.
Figure 6B:
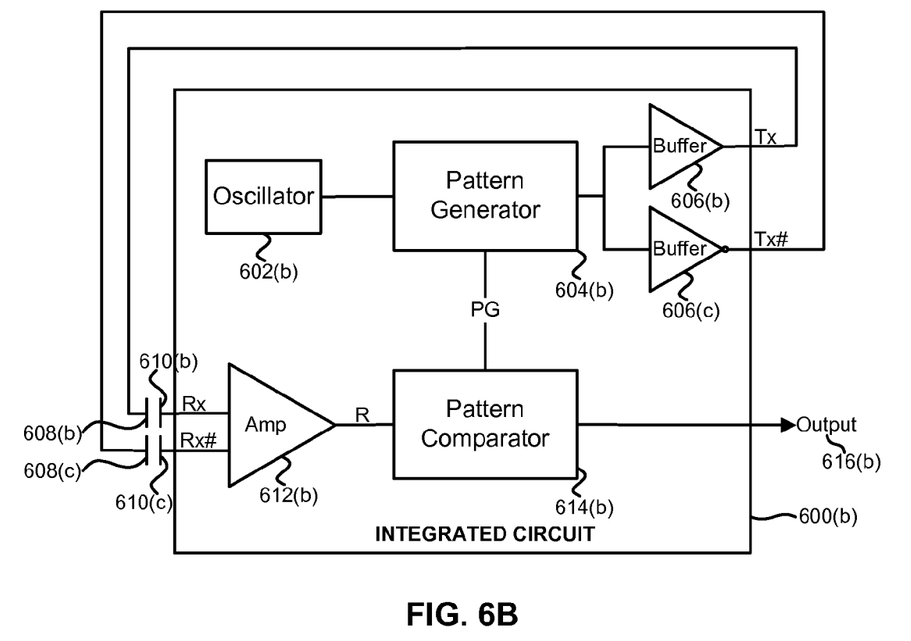
Figure 6C:
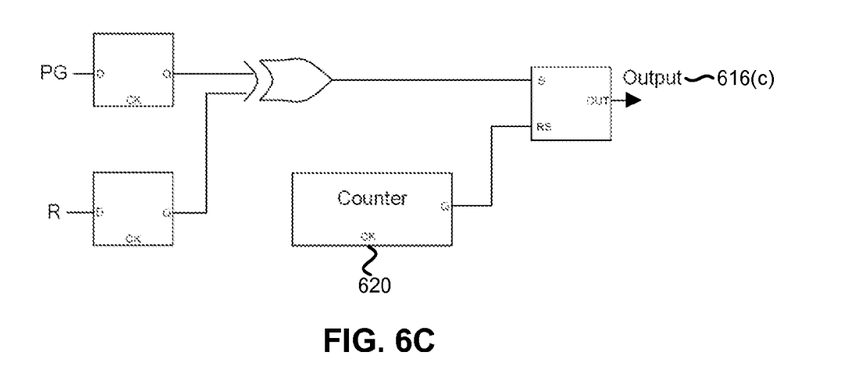
FIG. 6C illustrates a circuit diagram of the major components comprising an embodiment of a pattern comparator.

FIGS. 6A-6B illustrate circuit diagrams of two different sensor embodiments that show the major components of the integrated circuit of the disclosed sensor design. The embodiment of FIG. 6A corresponds to a single-ended, single-plane/passive coupler configuration such as that of FIG. 4A while the embodiment of FIG. 6B corresponds to a differential-mode, separate plane configuration such as that of FIG. 5A. Integrated circuit 600 includes oscillator 602, which provides a clock or reference frequency. Pattern generator 604 of integrated circuit 600 generates a patterned signal that has a low likelihood of being replicated by random noise. For example, pattern generator 604 may generate a noise rejecting code word of n-bit length, wherein n is a fixed or configurable value. The signal output by pattern generator 604 is amplified by buffer 606. The amplified signal output by buffer 606 is output from integrated circuit 600 and drives transmitter 608, which transmits the signal. A signal received by receiver 610 is input into integrated circuit 600 and amplified by amplifier 612. The amplified received signal is compared to the transmitted signal by pattern comparator 614. Output 616 of integrated circuit 600 indicates whether or not the received signal matches the transmitted signal based on the determination made by comparator 614. In the embodiment of FIG. 6A, the position of floating coupler 618 determines the extent of capacitive coupling, if any, between transmitter 608 and receiver 610. In the embodiment of FIG. 6B, the relative positions of corresponding transmitters 608 and receivers 610 determine the extent of capacitive coupling, if any, between transmitter 608 and receiver 610 pairs, which are modeled in FIG. 6B by the depicted capacitor plates. FIG. 6C illustrates a circuit diagram of the major components comprising an embodiment of pattern comparator 614. As depicted, each bit of the received and transmitted signals is compared as counter 620 counts to n (for an n-bit pattern), sends a reset pulse, and repeats. Although some of the major components of the integrated circuit of the disclosed sensor design have been described with respect to FIGS. 6A-6C, the integrated circuit may be configured in any appropriate manner and may comprise any one or more other appropriate components or circuitry, such as a digital-to-analog converter, an analog-to-digital converter, etc.

In various embodiments, the sensor design may include any one or more appropriate optional components. For example, in some embodiments, a tuning capacitor (e.g., having a value between 1-10 pF) may be connected between the receiver output and ground to adjust sensitivity. A shunting capacitor effectively trims down the sensing range. In some cases, the capacitor is external to the integrated circuit of the sensor. In some embodiments, the sensitivity can be adjusted by adding a boost circuit and/or a charge pump to the integrated circuit that increases the strength of the transmitted signal. Increasing the transmitted signal voltage in some cases increases the sensitivity range of the sensor. In some embodiments, active power consumption of the sensor may be reduced by adding circuitry to the integrated circuit that facilitates a sleep/wake duty cycle for the integrated circuit so that it is not constantly operating. For example, the integrated circuit may be configured to be operational only 10 ms out of every 1 s. In such cases, the sleep/wake duty cycle may be user configurable. In some embodiments, an analog filter may be employed between the receiver and amplifier for the received signal that has a passband centered around the transmitted signal frequency. Such a filter facilitates preventing noise picked up by the receiver from being processed by the integrated circuit, resulting in reduced active power consumption by the integrated circuit in many cases.

The sensor may optionally include auto-calibration circuitry. In some embodiments, such circuitry may be employed to automatically and dynamically compensate for any inherent self-coupling between the transmitter and receiver. For example, in the embodiments in which the transmitter and receiver are in the same plane (e.g., in the configurations of FIGS. 4A, 5B, and 5C), the proximity between the transmitter and receiver may induce a degree of self-coupling even when in a state when they should not be coupled. The extent of self-coupling may vary in each sensor based on non-ideal manufacturing tolerances (e.g., antenna pad geometry, material type, etc.) as well as the environment in which the sensor is deployed (e.g., nearby conductive objects may increase self-coupling). Auto-calibration may be performed during an unmatch state of the sensor when the transmitter and receiver should not be coupled. In some embodiments, the auto-calibration circuitry comprises a finite state machine that gradually steps up the reference voltage of the received signal amplifier until the self-coupling voltage is cancelled or nearly cancelled. In other embodiments, any other appropriate circuitry to correct for self-coupling may be employed. In some embodiments, an option to enable or disable the auto-calibration feature of the sensor is provided.

The disclosed sensor design may similarly be employed as a touch and/or presence detection sensor. In some embodiments, such a sensor comprises the configuration of FIG. 2A, and the transmitter and receiver are intentionally placed in close proximity to one another to trigger self-coupling. In such cases, a match state occurs when the self-coupling or electric field between the transmitter and receiver is not disturbed by an external object, and an unmatch state occurs when the self-coupling or electric field between the transmitter and receiver is disturbed by an external object. Any auto-calibration circuitry optionally employed with such a sensor would operate in a manner opposite to that described above, i.e., the associated finite state machine would gradually step down the reference voltage to compensate for any self-coupling that may exist in the unmatch state. An example application of such a sensor with respect to a cell phone includes de-activating the touch screen of a smart phone during active call time when human presence in close proximity to the touch screen is detected. Such a sensor may also be employed to detect human proximity to a system (e.g., a tablet computer or other electronic device) to wake up the system.

As described, the disclosed sensor design may be employed to detect touch, proximity, and/or presence. In some embodiments, for example, one or more such sensors are deployed in electronic devices (e.g., cell phones, tablets, laptops, e-books, etc.) that are often in close proximity or contact with the human body during use and whose radio transmissions may potentially be detrimental to the human body. For instance, some studies have linked cell phone usage with increased risks of cancer. Cell phone manufacturers typically issue recommendations to reduce radiation exposure such as by limiting usage (especially by more susceptible users such as children and pregnant women), positioning a device at least a prescribed distance away from the body (e.g., positioning a phone at least 10-20 mm away from the ear), using a hands free configuration or device, etc. Due to the currently unknown long term effects to the human body from the radiation exposure resulting from using such devices, reducing as well as preventing unsafe levels of exposure are prudent. The disclosed sensor design provides a low cost and low power solution for detecting human contact or proximity to an electronic device, e.g., during RF transmissions, so that, for instance, compliance with a manufacturer's safe usage zone can be enforced, a user can be made aware of potentially unsafe radiation exposure levels, and/or so that transmission power can be automatically adjusted (e.g., reduced) based on detected exposure levels.

Figure 7A:
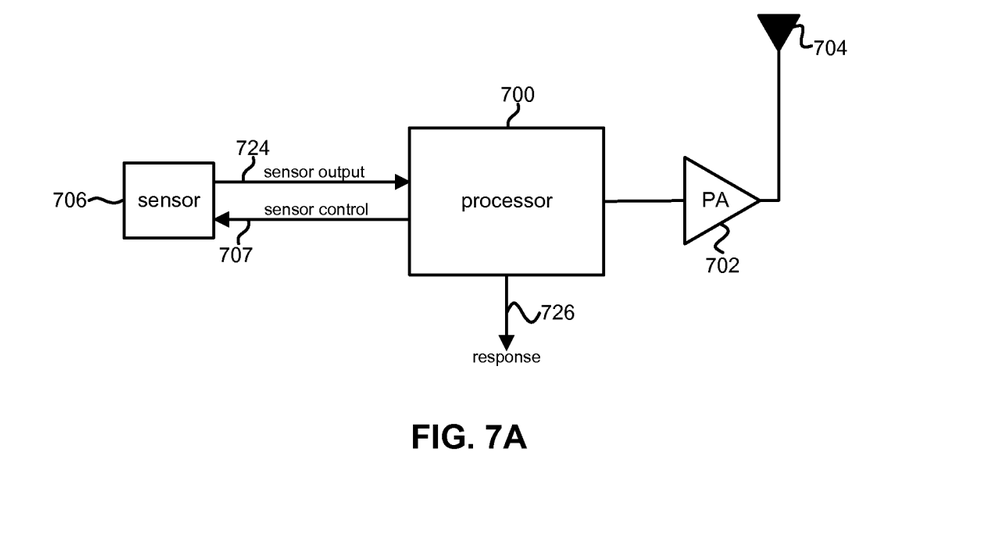
FIG. 7A is a high level system diagram illustrating an embodiment of a manner in which a sensor is employed to detect human proximity.

FIG. 7A is a high level system diagram illustrating an embodiment of a manner in which a sensor is employed to detect human proximity. In some embodiments, the components depicted in FIG. 7A are part of an electronic device such as a cell phone, tablet, laptop, e-book, or other device configured for radio communications via a wireless or mobile device network such as a cellular network, WiFi, WiMAX, Bluetooth, etc. Processor 700 activates power amplifier 702 during active data transmission via antenna 704. For example, power amplifier 702 and antenna 704 are activated when a user initiates a cell phone call or otherwise initiates data communication via a wireless network. In some embodiments, when power amplifier 702 and/or antenna 704 are activated, processor 700 also activates sensor 706 via control signal 707. Sensor 706 may have any of the above described configurations and/or features. For example sensor 706 may comprise the configuration of FIG. 2A and FIGS. 6A-6C (without the passive coupler).

Figure 7B:
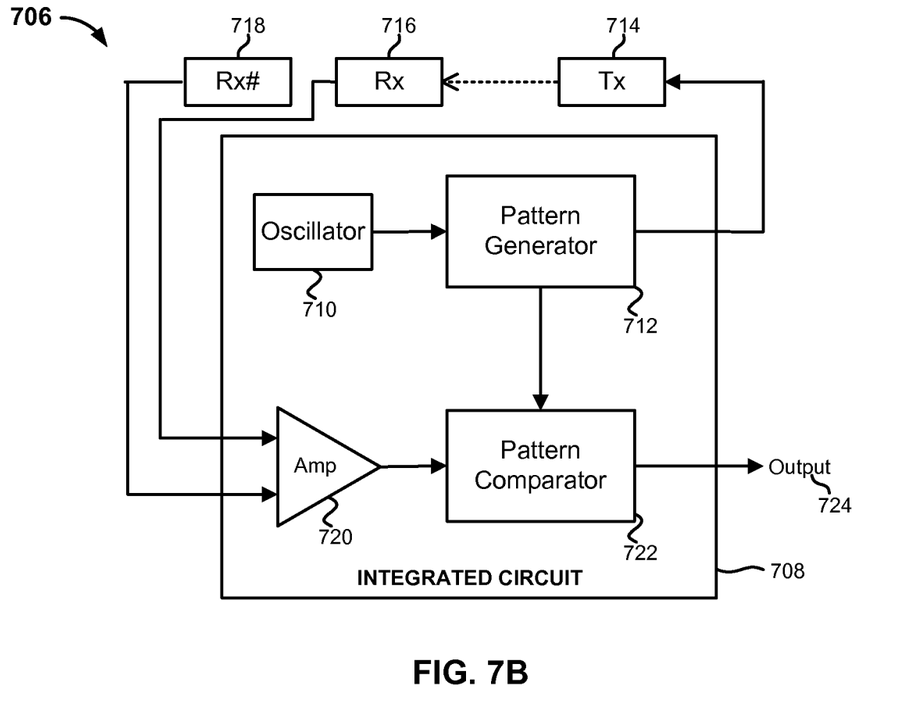
FIG. 7B illustrates a high level block diagram of an embodiment of a sensor.

FIG. 7B illustrates a high level block diagram of an embodiment of sensor 706. Integrated circuit 708 includes oscillator 710 driving pattern generator 712 which generates a patterned signal that has a low likelihood of being replicated by random noise. For example, pattern generator 712 may generate a noise rejecting code word of n-bit length, wherein n is a fixed or configurable value. The signal output by pattern generator 712 is transmitted by transmitter 714. Receiver 716 is configured to receive the signal transmitted by transmitter 714. In the given configuration, transmitter 714 and receiver 716 are intentionally placed in close proximity to one another to trigger self-coupling unless perturbed by an external object such as the human body or part thereof The given example optionally includes a second receiver 718 configured to eliminate common mode noise from the external environment. The received signal is input into integrated circuit 708 and amplified by amplifier 720. The amplified received signal is compared to the transmitted signal by pattern comparator 722. Output 724 of integrated circuit 708 indicates whether or not the received signal matches the transmitted signal based on the determination made by comparator 722. A match state is detected by sensor 706 when the self-coupling or electric field between transmitter 714 and receiver 716 is not disturbed or is not significantly disturbed by close proximity or contact by the human body or another external object, and an unmatch state is detected when the self-coupling or electric field between transmitter 714 and receiver 716 is disturbed by the human body or another external object. Sensor 706 may be configured for any desired sensitivity range and/or thresholds. In various embodiments, output signal 724 of sensor 706 may be digital or analog. For example, output signal 724 may be a binary signal with two possible states indicating that a human/object is in proximity or that a human/object is not in proximity. Alternatively, output signal 724 may be an analog signal with a plurality o f possible states or values, each indicating a degree or extent of human proximity or disturbance of the capacitive coupling between transmitter 714 and receiver 716.

Returning to FIG. 7A, based on output signal 724 of sensor 706, processor 700 determines whether a human/object is in proximity and/or the extent of proximity. Based on the value or state of signal 724, processor 700 facilitates an appropriate response 726. Any appropriate or desired response or type of response may be selected or specified for various values or states of output signal 724, including no response if no human/object proximity is detected or human/object proximity within a permitted limit is detected. In some cases, response 726 comprises an alarm, warning, or other notification, for example, indicating exposure to radiation levels that exceed a threshold or safe limit. For example, response 726 may comprise an audio, visual, and/or haptic indication such as beep, flash, and/or vibration of the associated device. In some cases, response 726 may comprise (possibly graduated) transmission power reductions, for instance, based on the degree of proximity. In some cases, response 726 is based on factors such as usage time and/or average exposure. For example, response 726 may be initiated only if the violation of a safe radiation limit exceeds a prescribed amount of time. In some cases, response 726 comprises powering off an associated device. Although some examples have been described, sensor 706 may be configured to detect any two or more proximity states, and processor 700 may be configured to facilitate any appropriate response for the various proximity states.

One or more sensors such as sensor 706 of FIGS. 7A-7B may be embedded into electronic devices to incorporate a radiation detection, warning, and/or mitigation system. Such a system may be employed to give feedback to users when they violate radiation exposure thresholds. For example, such a sensor embedded in a cell phone can be employed to monitor the proximity of the phone with the user's head during active radio transmissions and generate an audible and/or vibration warning during use when the phone is positioned too close to the head. Similarly, one or more sensors may be embedded in a laptop, tablet, e-book, or other such device to monitor the proximity of the device to the body during active radio transmissions and generate an appropriate warning or facilitate another action when safe usage thresholds or limits are not abided. Although some of the described examples are with respect to detecting the proximity of a human body to a device engaged in radio communications, a similar sensor configuration may be employed to detect the presence or proximity of other external objects that disrupt the self-coupling between the transmitter and receiver of the sensor.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A sensor embedded in a mobile device, comprising:
    a transmitter configured to transmit a transmit signal and a receiver configured to receive a receive signal via capacitive coupling between the receiver and the transmitter; and
    a circuit configured to:
        compare the transmit signal and the receive signal; and
        in the event that the receive signal does not sufficiently match the transmit signal, generate an output signal indicating human proximity to the mobile device, wherein the output signal is employed to facilitate an appropriate response in the mobile device in response to the detected human proximity to the mobile device.

2. The sensor of claim 1, wherein the receive signal does not sufficiently match the transmit signal when the capacitive coupling between the transmitter and the receiver is disturbed.

3. The sensor of claim 1, wherein the appropriate response comprises de-activating a touch screen of the mobile device.

4. The sensor of claim 1, wherein the appropriate response comprises waking up the mobile device from a sleep state.

5. The sensor of claim 1, wherein the output signal is used to determine that a radiation threshold associated with using the mobile device is violated.

6. The sensor of claim 5, wherein the radiation threshold is based on a relative distance between the mobile device and a body of a user using the mobile device.

7. The sensor of claim 5, wherein the response is based on an amount of time of the radiation threshold violation.

8. The sensor of claim 1, wherein the sensor is activated according to a sleep and wake duty cycle so that the sensor is not constantly operating.

9. The sensor of claim 1, wherein the circuit is further configured to eliminate noise from an external environment.

10. The sensor of claim 1, wherein the output signal comprises a digital signal or an analog signal.

11. The sensor of claim 1, wherein the response comprises one or more of an audio, a visual, and a haptic response.

12. The sensor of claim 1, wherein the response comprises an alarm, a warning, or a notification.

13. The sensor of claim 1, wherein the response comprises automatically reducing a transmission power of the mobile device.

14. The sensor of claim 1, wherein the sensor is configured to enforce a manufacturer's safe usage zone of the mobile device.

15. A system, comprising:
an antenna configured to facilitate radio communication of the system;
a sensor for sensing radiation exposure associated with radio communication of the system configured to:
determine an extent of capacitive coupling between a transmitter and a receiver; and
generate an output signal indicating the extent of capacitive coupling; and
a processor coupled to the antenna and the sensor and configured to:
activate the antenna and the sensor during radio communication of the system;
determine that the output signal indicates that a radiation threshold associated with the radio communication has been violated; and
facilitate a response to the radiation threshold violation in the system.

16. The system of claim 15, wherein the sensor is activated according to a sleep and wake duty cycle so that the sensor is not constantly operating.

17. The system of claim 15, wherein the sensor includes circuitry to eliminate common mode noise from an external environment.

18. The system of claim 15, wherein the output signal comprises a digital or an analog signal.

19. The system of claim 15, wherein the radiation threshold associated with the radio communication is violated when the capacitive coupling between the transmitter and the receiver is sufficiently disturbed.

20. The system of claim 15, wherein the radiation threshold is based on a relative distance between the system and a body of a user using the system.

21. The system of claim 15, wherein the response to the radiation threshold violation in the system comprises an alarm, warning, or other notification indicating that the radiation threshold has been violated.

22. The system of claim 15, wherein the response to the radiation threshold violation in the system comprises one or more of an audio, visual, and haptic response.

23. The system of claim 15, wherein the processor is further configured to determine an amount of time the radiation threshold has been violated and wherein the response is based on the amount of time.

24. The system of claim 15, wherein to facilitate a response comprises to automatically reduce a transmission power of the radio communication.

25. The system of claim 15, wherein the processor is configured to enforce a manufacturer's safe usage zone of the system.

26. The system of claim 15, wherein the system is configured for radio communication via a wireless or mobile network.

27. The system of claim 15, wherein the system comprises a cell phone, tablet, laptop, or e-book.

28. A method, comprising:
activating an antenna and a sensor during radio communication of a device, wherein the sensor is configured to determine an extent of capacitive coupling between a transmitter and a receiver and generate an output signal based on the extent of capacitive coupling;
determining that the output signal indicates that a radiation threshold associated with the radio communication has been violated; and
facilitating a response to the radiation threshold violation in the device.

29. The method of claim 28, wherein the sensor is activated according to a sleep and wake duty cycle so that the sensor is not constantly operating.

30. The method of claim 28, wherein the sensor includes circuitry to eliminate noise from an external environment.

31. The method of claim 28, wherein the output signal comprises a digital or an analog signal.

32. The method of claim 28, wherein the radiation threshold associated with the radio communication is violated when the capacitive coupling between the transmitter and the receiver is sufficiently disturbed.

33. The method of claim 28, wherein the radiation threshold is based on a relative distance between the device and a body of a user using the device.

34. The method of claim 28, wherein the response to the radiation threshold violation in the device comprises an alarm, warning, or other notification indicating that the radiation threshold has been violated.

35. The method of claim 28, wherein the response to the radiation threshold violation in the device comprises one or more of an audio, a visual, and a haptic response.

36. The method of claim 28, wherein the response is based on an amount of time of the radiation threshold violation.

37. The method of claim 28, wherein facilitating a response comprises automatically reducing a transmission power of the radio communication.

38. The method of claim 28, wherein facilitating a response comprises enforcing a manufacturer's safe usage zone of the device.

39. The method of claim 28, wherein the device is configured for radio communication via a wireless or mobile network.

40. The method of claim 28, wherein the device comprises a cell phone, tablet, laptop, or e-book.

41. A method, comprising:
configuring a transmitter to transmit a transmit signal and a receiver to receive a receive signal via capacitive coupling between the receiver and the transmitter; and
configuring a circuit to:
compare the transmit signal and the receive signal; and in the event that the receive signal does not sufficiently match the transmit signal, generate an output signal indicating human proximity to an associated mobile device, wherein the output signal is employed to facilitate an appropriate response in the mobile device in response to the detected human proximity to the mobile device.

42. The method of claim 41, wherein the receive signal does not sufficiently match the transmit signal when the capacitive coupling between the transmitter and the receiver is disturbed.

43. The method of claim 41, wherein the appropriate response comprises deactivating a touch screen of the mobile device.

44. The method of claim 41, wherein the appropriate response comprises waking up the mobile device from a sleep state.

45. The method of claim 41, wherein the output signal is used to determine that a radiation threshold associated with using the mobile device is violated.

46. The method of claim 45, wherein the radiation threshold is based on a relative distance between the mobile device and a body of a user using the mobile device.

47. The method of claim 45, wherein the response is based on an amount of time of the radiation threshold violation.

48. The method of claim 41, wherein the transmitter, the receiver, and the circuit are activated according to a sleep and wake duty cycle so that they are not constantly operating.

49. The method of claim 41, wherein the circuit is further configured to eliminate noise from an external environment.

50. The method of claim 41, wherein the output signal comprises a digital signal or an analog signal.

51. The method of claim 41, wherein the response comprises one or more of an audio, a visual, and a haptic response.

52. The method of claim 41, wherein the response comprises an alarm, a warning, or a notification.

53. The method of claim 41, wherein the response comprises automatically reducing a transmission power of the mobile device.

54. The method of claim 41, wherein the output signal is used to enforce a manufacturer's safe usage zone of the mobile device.

* * * * *